United States Patent
Sekihara et al.

(10) Patent No.: US 8,377,362 B2
(45) Date of Patent: Feb. 19, 2013

(54) METHOD FOR MANUFACTURING MICRO-CHANNEL, DIE FOR MOLDING MICRO-CHANNEL CHIP, AND MICRO-CHANNEL CHIP

(75) Inventors: Kanji Sekihara, Toyokawa (JP); Takehiko Goshima, Kunitachi (JP)

(73) Assignee: Konica Minolta Opto, Inc., Tokyo (JP)

( * ) Notice: Subject to any disclaimer, the term of this patent is extended or adjusted under 35 U.S.C. 154(b) by 63 days.

(21) Appl. No.: 13/059,494

(22) PCT Filed: Aug. 17, 2009

(86) PCT No.: PCT/JP2009/064388
§ 371 (c)(1),
(2), (4) Date: Feb. 17, 2011

(87) PCT Pub. No.: WO2010/021306
PCT Pub. Date: Feb. 25, 2010

(65) Prior Publication Data
US 2011/0133364 A1    Jun. 9, 2011

(30) Foreign Application Priority Data
Aug. 20, 2008  (JP) .................................. 2008-211933

(51) Int. Cl.
*B29C 33/42* (2006.01)
*B29C 45/16* (2006.01)

(52) U.S. Cl. ...................... 264/328.1; 422/503; 425/542

(58) Field of Classification Search ............... 264/328.1; 425/542; 422/503
See application file for complete search history.

(56) References Cited

U.S. PATENT DOCUMENTS

| | | | | |
|---|---|---|---|---|
| 5,804,022 | A | * | 9/1998 | Kaltenbach et al. ........... 156/257 |
| 5,932,315 | A | * | 8/1999 | Lum et al. ...................... 428/172 |
| 2003/0082632 | A1 | * | 5/2003 | Shumate .......................... 435/7.1 |
| 2004/0195728 | A1 | * | 10/2004 | Slomski et al. ............. 264/328.1 |
| 2004/0241049 | A1 | * | 12/2004 | Carvalho ....................... 422/100 |
| 2006/0078471 | A1 | * | 4/2006 | Witty et al. .................... 422/100 |

FOREIGN PATENT DOCUMENTS

| | | |
|---|---|---|
| JP | 2000-108161 | 4/2000 |
| JP | 2003-062797 | 3/2003 |
| JP | 2004-122751 | 4/2004 |
| JP | 2005-293168 | 10/2005 |
| JP | 2008-000995 | 1/2008 |

* cited by examiner

*Primary Examiner* — Jill Heitbrink
(74) *Attorney, Agent, or Firm* — Cozen O'Connor (57) ABSTRACT

A die (100) is provided with: a cavity which can contain a molten resin; a micro-structure (102) provided on a molding transfer surface (101) forming the cavity such that the fine structure protrudes to the cavity side from the molding transfer surface (101); and a anti-shrinkage convex section (103) protruding higher than the micro-structure (102) to the cavity side from one surface. A molten resin is applied to the die (100) and the surface of the die is relatively removed in the order of the micro-structure (102) and the anti-shrinkage convex section (103) from a resin substrate (001) formed by solidifying the resin.

7 Claims, 7 Drawing Sheets

PRIOR ART

FIG. 11

PRIOR ART

METHOD FOR MANUFACTURING MICRO-CHANNEL, DIE FOR MOLDING MICRO-CHANNEL CHIP, AND MICRO-CHANNEL CHIP

RELATED APPLICATIONS

This application is a U.S. National Phase Application under 35 USC 371 of International Application PCT/JP2009/064388 filed Aug. 17, 2009.

This application claims the priority of Japanese application 2008-211933 filed Aug. 20, 2008, the entire content of which is hereby incorporated by reference.

TECHNICAL FIELD

The present invention relates to a micro-channel chip manufacturing method by joining a resin substrate in which a micro-channel is formed, a micro-channel chip molding die used for the manufacturing, and a micro-channel chip manufactured by the manufacturing method.

BACKGROUND

Devices referred to as microanalysis chips or μTAS (Micro Total Analysis Systems) have been put to practical use, in which using a microfabrication technology, micro-channels and circuits are formed on a silicon or glass substrate, and thereby chemical reaction, separation, or analysis is carried out in a micro-space by introducing a liquid sample such as a nucleic acid, protein, or blood into such micro-channels. It is conceivable that these micro-channel chips have such advantages that the used amount of a sample or a reagent or the discharge amount of waste liquid is reduced, and small-foot print, portable, and inexpensive systems are realized.

Micro-channel chips are manufactured in such a manner that 2 members in which at least one member thereof has been subjected to microfabrication are bonded together. Conventionally, for micro-channel chips, glass substrates have been used and various microfabrication methods have been proposed. However, such glass substrates are unsuitable for mass production and exhibit extremely high cost. Therefore, the development of resin micro-channel chips, which are inexpensive and disposable, has been desired.

As a method for manufacturing a resin micro-channel chip, a method for joining a resin substrate in which a channel groove is formed and a resin substrate to cover a channel groove is available. To join resin substrates together, listed are a welding method to join resin substrates by heating using a heating plate, hot air, a heating roll, ultrasound, vibration, or a laser, a joining method to join resin substrates using an adhesive or a solvent a joining method utilizing adhesion properties of resin substrates themselves; and a substrate joining method via surface treatment such as plasma treatment for resin substrates (for example, refer to Patent Document 1).

Figure 10:
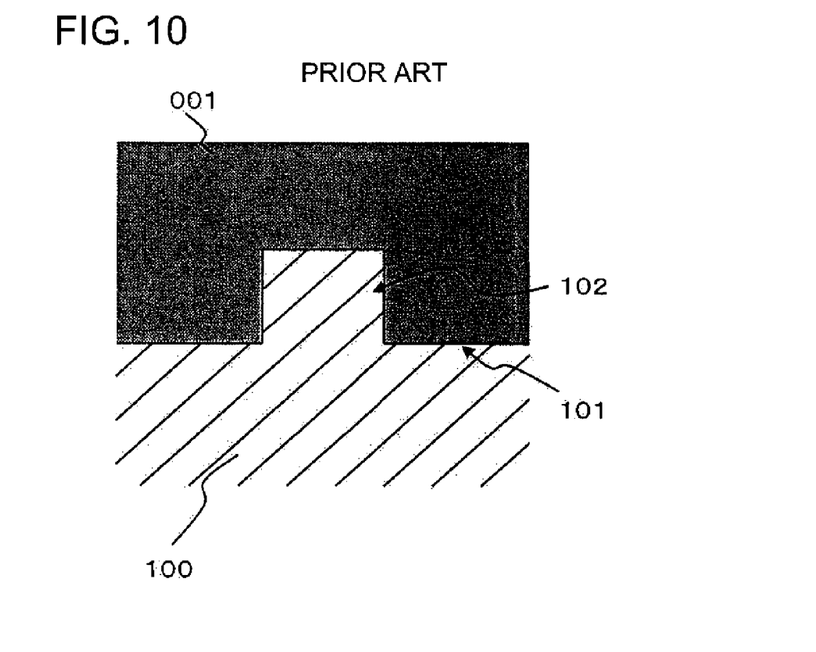
FIG. 10 is a schematic cross-sectional view in which a resin substrate has been formed by pouring a resin into a conventional micro-channel chip die.
Figure 11:
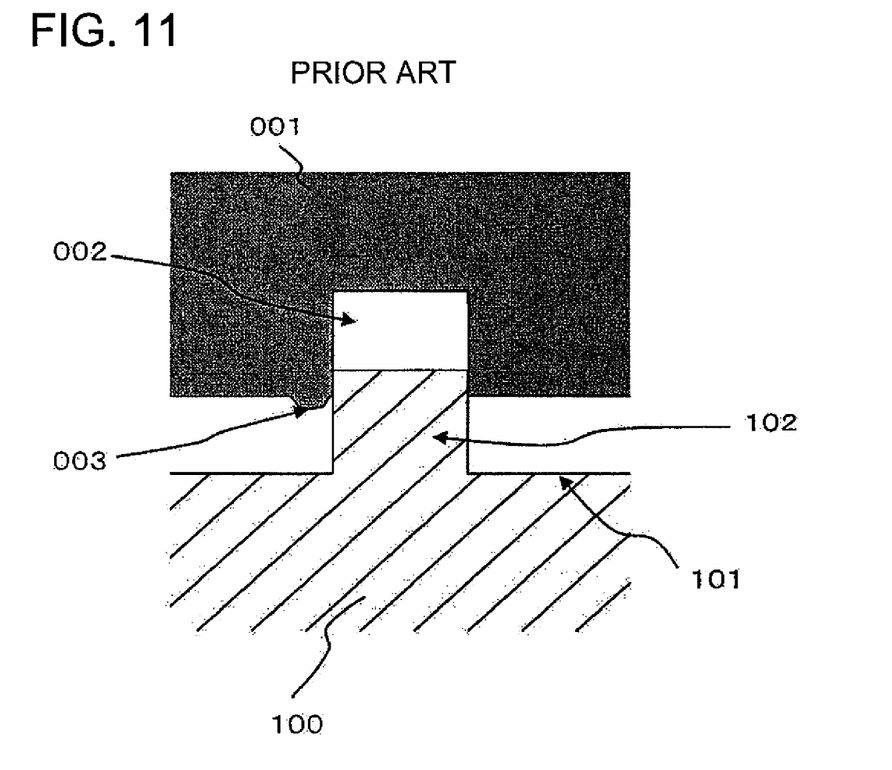
FIG. 11 is a schematic cross-sectional view of the time of mold release molding after a resin has been poured into the conventional micro-channel chip die.

FIG. 10 is a schematic cross-sectional view in which a resin substrate has been formed by pouring a resin into a conventional micro-channel chip molding die. When a resin substrate is joined, as shown in FIG. 10, a melted resin is poured into a micro-channel chip molding die 100 (the portion expressed by oblique lines) and then cooled to mold a resin substrate 001 (the filled-in portion) having a channel groove. The micro-channel chip molding die 100 has a micro-structure 102 to carry out transfer to a surface 101 for transferring a channel groove to a resin substrate (hereinafter referred to as a "molding transfer surface 101"). Then, the micro-channel chip molding die 100 transfers a micro-structure 102 provided for its own molding transfer surface 101 to a poured resin to mold a micro-channel 002 as shown in FIG. 11. FIG. 11 is a schematic cross-sectional view showing the time of mold release molding (releasing a resin substrate from a die) after a resin has been poured into a conventional micro-channel chip molding die.

However, as described in Patent Document 1, in molding in which a micro-channel chip molding die 100 having a micro-structure on the molding transfer surface is used, due to the effect of molding shrinkage with cooling of a resin substrate 001 itself and the runner section being a section to pour a resin into a die, the resin in the edge portion of the micro-structure is raised or broken during releasing. Thereby, as shown in FIG. 11, there occurs a phenomenon in which deformation 003 is generated in part of a resin substrate 001 having been removed from a die 100 in the order of submicron—about 5 μm. In this molded resin substrate 001, for joining as described above, the joining surface (the portion where 2 resin substrates are bonded) in which a micro-channel 002 is formed is required to exhibit high flatness. Namely, when the flatness of the joining surface is degraded due to deformation occurrence as described above, it may be difficult to join resin substrates 001 or to form a micro-channel 002.

PRIOR ART DOCUMENT

Patent Document

Patent Document 1: Unexamined Japanese Patent Application Publication No. 2004-106508

BRIEF DESCRIPTION OF THE INVENTION

Problems to be Solved by the Invention

In view of such circumstances, the present invention was completed. An object of the present invention is to provide a micro-channel chip manufacturing method to reduce deformation in a micro-channel due to molding shrinkage and a micro-channel chip molding die used for the same.

Means to Solve the Problems

To achieve the above object, one object of the present invention relates to a micro-channel chip manufacturing method is characterized in that the method comprises the steps of injecting a melted resin into a die having a cavity capable of containing the melted resin, a micro-structure provided on a surface of the die to form the cavity so as to protrude toward the cavity side from the surface, and a convex section protruding higher than the micro-structure toward the cavity side from the surface; and removing the surface of the die relatively from the resin substrate having been formed by solidifying the injected resin in an order of the micro-structure and the convex section.

According to an embodiment of the invention, the above-described micro-channel chip manufacturing method includes a feature of joining another resin substrate to the resin substrate so as to cover a portion of the resin substrate where the micro-structure has been transferred and to lie at a portion separated from a hole formed by the convex section.

According to an embodiment of the invention, the above-described micro-channel chip manufacturing method includes a feature in which the convex section is arranged in a vicinity of an outer edge of the surface which is most distant from an injection opening to inject a melted resin into the cavity provided in the die.

Another aspect of the invention relates to a further micro-channel chip manufacturing method comprising the steps of: injecting a melted resin into a die having a cavity capable of containing the melted resin, a micro-structure provided on a surface of the die to form the cavity so as to protrude toward the cavity side from the surface, and a concave section provided deeper than the height of the micro-structure in the direction opposed to the protruding direction of the micro-structure; and removing the surface of the die relatively from the resin substrate having been formed by solidifying the injected resin in an order of the micro-structure and the concave section.

The above-described further micro-channel chip manufacturing method comprises joining another resin substrate to the resin substrate so as to cover a portion of the resin substrate where the micro-structure has been transferred and to lie at a portion separated from a protrusion formed by the concave section.

The above-described further micro-channel chip manufacturing method is characterized in that the concave section is arranged in a vicinity of an outer edge of the surface which is most distant from an injection opening to inject a melted resin into the cavity provided in the die.

Another aspect of the present invention relates to a die for molding a micro-channel chip to mold a resin substrate of the micro-channel chip in which two resin substrates are joined and a micro-channel groove is formed on a surface of at least one of the two resin substrates, the two resin substrates are joined so that the surface where the micro-channel groove is formed faces inward, the die for molding comprising: a cavity capable of containing a melted resin to form the resin substrate in which the micro-channel groove is formed, a micro-structure provided on a surface that forms the cavity so as to protrude toward the cavity side from the surface, and a convex section which protrudes higher than the micro-structure toward the cavity side from the surface.

The above-described die for molding a micro-channel chip is characterized in that the convex section is provided in a portion other than a surface where the two resin substrates are joined.

The above-described die for molding a micro-channel chip is a die for molding a micro-channel chip to mold a resin substrate of the micro-channel chip in which two resin substrates are joined and a micro-channel groove is formed on a surface of at least one of the two resin substrates, the two resin substrates are joined so that the surface where the micro-channel groove is formed faces inward, the die for molding comprising: a cavity capable of containing a melted resin to form the resin substrate in which the micro-channel groove is formed, a micro-structure provided on a surface that forms the cavity so as to protrude toward the cavity side from the surface, and a concave section which is provide in a direction opposite to a protruding direction of the micro-structure and a depth of the concave section is greater than a height of the micro-structure.

The above-described die for molding a micro-channel chip is characterized in that the concave section is provided in a portion other than a surface where the two resin substrates are joined.

The above-described die for molding a micro-channel chip is characterized in that the micro-channel chip two resin substrates are joined and a micro-channel where liquid is introduced is formed on a surface of at least one of the two resin substrates by injection molding in which a melted resin is injected, the two resin substrates are joined so that the surface where the micro-channel is formed faces inward, the micro-channel chip comprising: a concave section longer than a maximum length in a depth direction of the micro-channel provided on the surface where the micro-channel is formed at a location other than the micro-channel.

The above-described die for molding a micro-channel chip characterized in that the two resin substrates cover a portion where the micro-structure has been transferred and are joined at a portion separated from the concave section.

Effects of the Invention

A micro-channel chip molding die according to the present invention has a constitution in which a convex or concave section longer than a micro-channel constituted in a cavity is provided. A micro-channel chip manufacturing method according to the present invention has a constitution in which a micro-channel is removed from a die and thereafter a concave or convex section is removed. Thereby, no micro-channel is removed lastly, whereby the reduction of a force due to molding shrinkage applied to the micro-channel is realized. Therefore, releasing deformation in the edge of the micro-channel is reduced and then an accurate micro-channel can be molded and also excellent flatness can be achieved.

Further, a convex or concave section longer than a micro-channel is provided in a portion other than the portion where joining to another resin substrate is made, whereby the effect of releasing deformation in the concave or convex section against the joining portion can be reduced.

Still further, a micro-channel chip according to the present invention is manufactured via accurate joining in which a resin substrate featuring high flatness is used, and the chip has an accurate micro-channel. Thereby, the micro-channel chip according to the present invention exhibits improved quantitative performance and reproducibility.

DESCRIPTION OF THE PREFERRED EMBODIMENT

Figure 1:
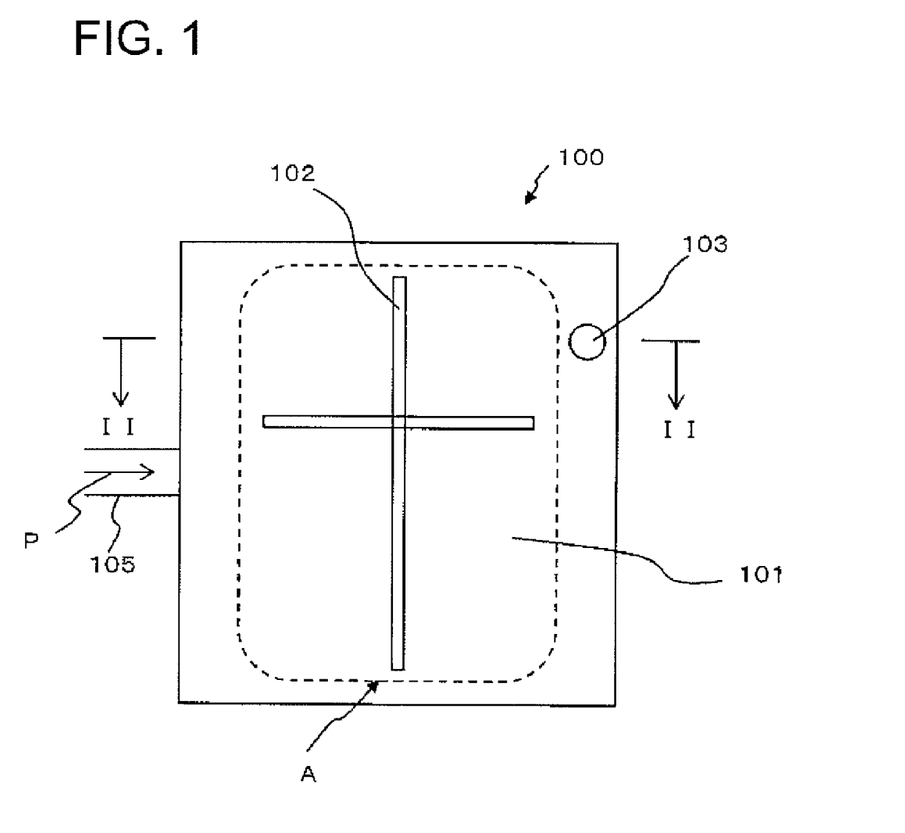
FIG. 1 is a schematic top view of a micro-channel chip molding die according to the present embodiment.
Figure 2:
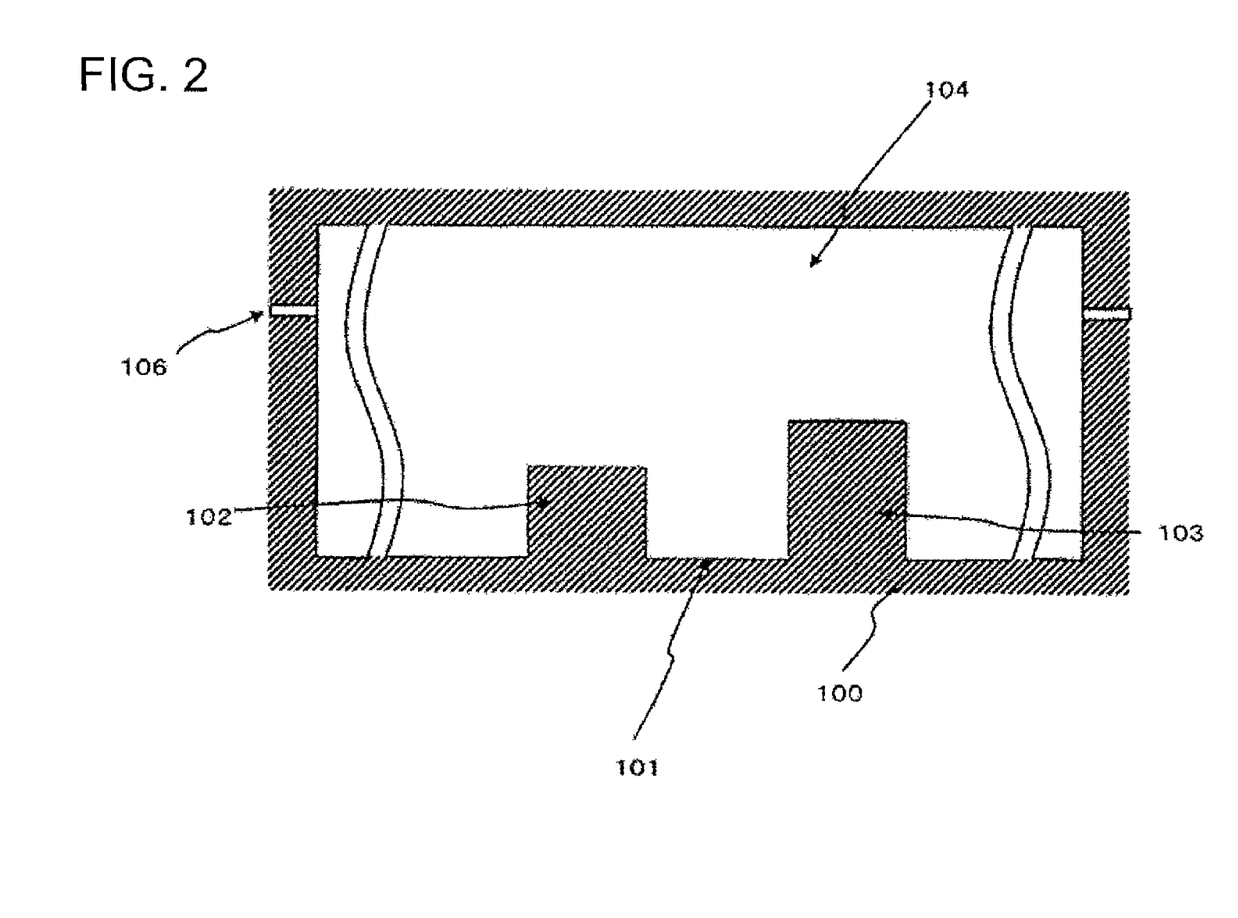
FIG. 2 is a cross-sectional view of the micro-channel chip molding die according to the present embodiment, being an II-II cross-sectional view of FIG. 1.
Figure 3:
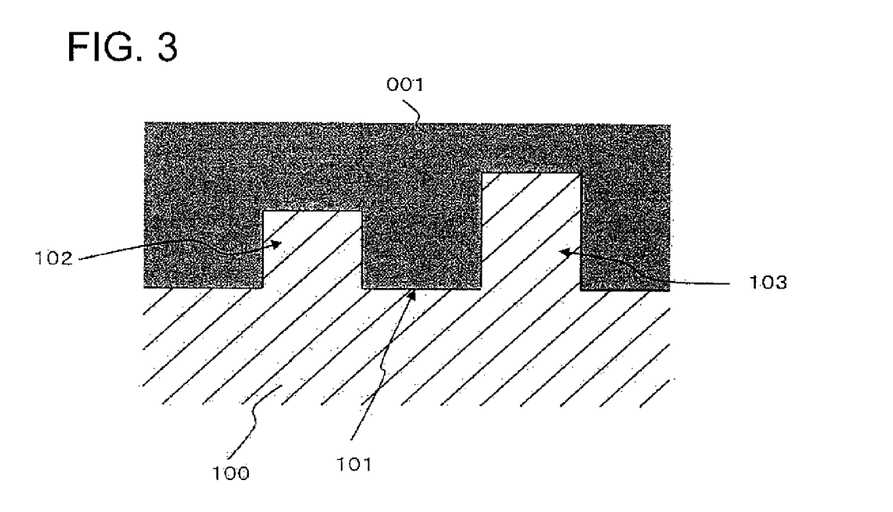
FIG. 3 is a schematic cross-sectional view in which a resin has been injected into the micro-channel chip molding die according to the present embodiment.
Figure 4:
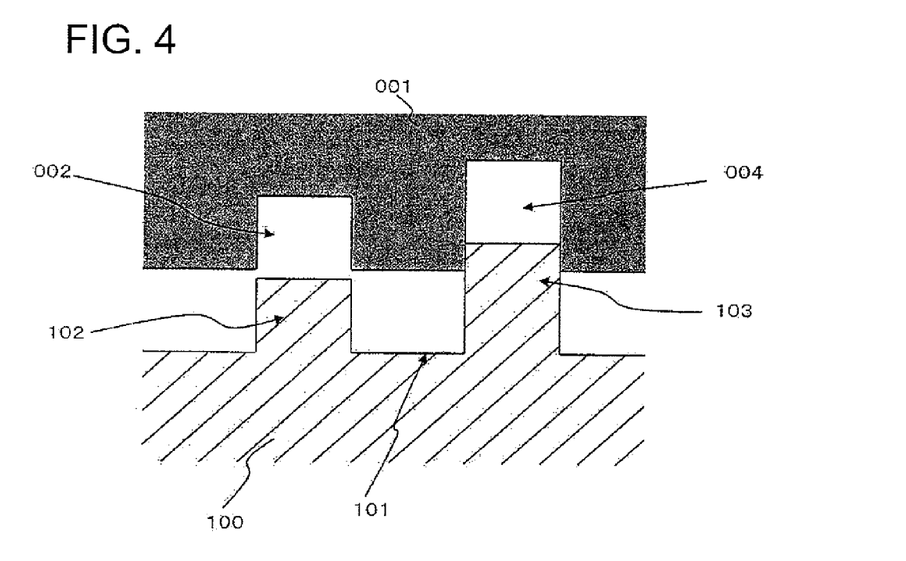
FIG. 4 is a schematic cross-sectional view of the moment when the micro-channel chip molding die according to the present embodiment is released from a molded resin substrate.
Figure 5:
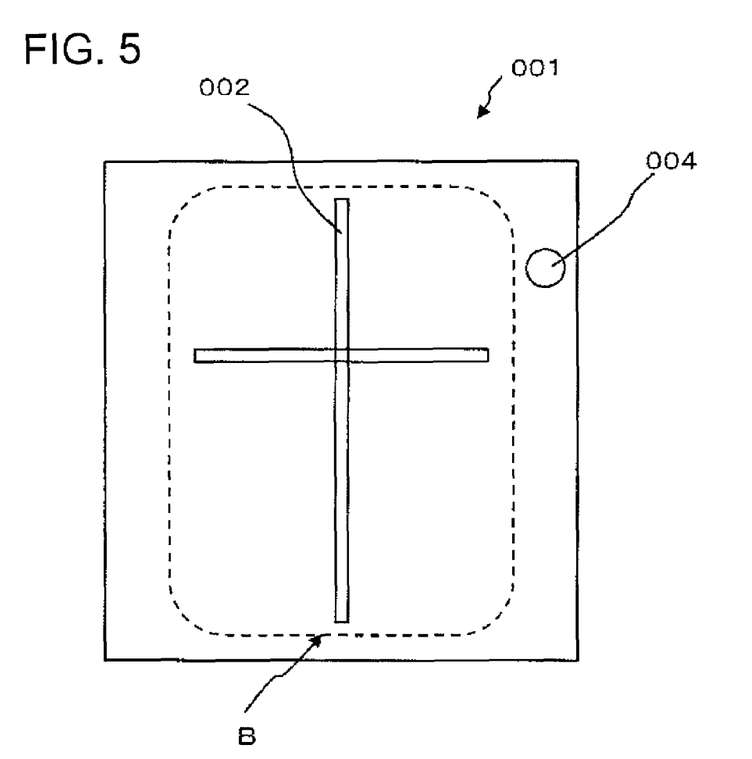
FIG. 5 is a schematic top view of one resin substrate having been molded by the micro-channel chip manufacturing method according to the present embodiment.

A micro-channel chip manufacturing method according to the embodiment of the present invention and a micro-channel chip molding die used for the method will now be described with reference to FIG. 1-FIG. 5. FIG. 1 is a schematic top view of the micro-channel chip molding die according to the present embodiment FIG. 2 is a cross-sectional view of the micro-channel chip molding die according to the present embodiment, being an II-II cross-sectional view of FIG. 1. FIG. 3 is a schematic cross-sectional view in which a resin has been injected into the micro-channel chip molding die according to the present embodiment FIG. 4 is a schematic cross-sectional view of the moment when the micro-channel chip molding die according to the present embodiment is released from a molded resin substrate. Then, FIG. 5 is a schematic top view of one resin substrate having been molded by the micro-channel chip manufacturing method according to the present embodiment.

As shown in FIG. 2, the micro-channel chip molding die 100 according to the present embodiment has a cavity 104 to inject a melted resin in the vertical direction with respect to the paper plane of FIG. 1. Hereinafter, the vertical direction with respect to the paper plane of FIG. 1 is referred to as "the cavity direction."

As shown in FIG. 1 and FIG. 2, one side of the micro-channel chip molding die 100 according to the present embodiment is formed as a molding transfer surface 101 to transfer a micro-structure 102 to a resin substrate 001 to be molded. The molding transfer surface 101 is provided with a micro-structure 102 and a anti-shrinkage convex section 103. As shown in FIG. 2, the micro-structure 102 and the anti-shrinkage convex section 103 protrude toward the cavity direction (protrude toward the cavity side from the molding transfer surface 101).

A resin substrate 001 formed using the micro-channel chip molding die 100 and another resin substrate 001 are joined together so that the surface where a micro-channel 002 has been formed faces inward to manufacture an actual micro-channel chip. Herein, the area A expressed by the dotted line represents an area where another resin substrate 001 is joined. The area A which is the portion where joining to another resin substrate 001 is made is the "joining surface." Hereinafter, the portion of the area A is referred to as the joining surface.

As shown in FIG. 3, the micro-structure 102 is a convex section to transfer a micro-channel 002 (refer to FIG. 4) on a resin substrate 001 molded by solidifying a resin having been injected into the cavity 104 (refer to FIG. 2) of a micro-channel chip molding die 100. The micro-structure 102 has a plurality of portions differing in height in the cavity direction. In the present embodiment, description will be made under the following condition: the highest portion of the cavity direction in the micro-structure 102 is the portion of the II-II cross-section shown in FIG. 2.

As shown in FIG. 1, the anti-shrinkage convex section 103 is provided in a portion other than the joining surface on the molding transfer surface 101. And, as shown in FIG. 2, the anti-shrinkage convex section 103 is higher than the highest portion of the cavity direction in the micro-structure 102 (in the present embodiment, the portion corresponding to the II-II cross-section in FIG. 2) (namely, the anti-shrinkage convex section 103 protrudes higher than the micro-structure 102). Herein, in the present embodiment, the size of the molding transfer surface direction of the anti-shrinkage convex section 103 is allowed to be a diameter of at least 20 μm as a circle (a circle having a diameter which is at least 10% larger than the smallest width in the micro-structure 102). However, this size is not specifically limited. Further, the shape of the anti-shrinkage convex section 103 may be a shape other than a circle.

As shown in FIG. 1, the micro-channel chip molding die 100 has a pipe-shaped runner section 105 to inject a resin serving as a material of a resin substrate 001. In the present embodiment, the runner section 105 is arranged to pour a resin in the direction of arrow P of FIG. 1. Further, the micro-channel chip molding die 100 is constituted so as to be opened (separated) up and down at the portion of line 106 of FIG. 2. The reason is that a resin substrate 001 having been molded by being solidified within the cavity 104 is removed. The micro-channel chip molding die 100 opens almost vertically with respect to the molding transfer surface 101.

A micro-channel chip molding die 100 is processed by well-known etching processing or mechanical processing-cutting processing/end milling processing. A convex section corresponding to a micro-structure 102 is formed on the molding transfer surface 101 of a micro-channel ship molding die 100, and farther a anti-shrinkage convex section 103 is formed in a portion other than the joining surface (area A). Further, such a micro-channel ship molding die 100 may be produced by electroforming processing. In this case, via etching processing, a micro-structure 102 and a convex section corresponding to the anti-shrinkage convex section 103 are formed in an electroforming master. Then, using the electroforming master, a micro-channel chip molding die 100 is produced.

<<Manufacturing Method of Micro-Channel Chip Molding Resin Substrate>>

Initially, a resin serving as a material of a resin substrate 001 is melted by heating at 250° C.-300° C. Then, the thus-melted resin serving as a material of a resin substrate 001 is poured into a micro-channel chip molding die 100 of about 100° C. through the runner section 105. Actually, based on glass transition temperature Tg and heat deformation temperature (load deflection temperature) HDT, the temperature of the micro-channel chip molding die 100 is determined to be a temperature of about the HDT. At the glass transition temperature Tg or more, no resin is solidified. Further, the heat deformation temperature HDT is a temperature where when a given load is applied, a resin is deformed at a certain magnitude. Then, the cavity 104 of the micro-channel chip molding die 100 is filled up with the poured resin.

Subsequently, the resin is cooled down to the temperature of the micro-channel chip molding die 100 (about 100° C.) to solidify the resin having been poured into the cavity 104. At this moment, the resin is solidified so as to be fitted into the micro-structure 102 provided on the molding transfer surface 101 of the micro-channel chip molding die 100. Namely, as shown in FIG. 3, a concave section is formed on a resin substrate 001 so as to be fitted into the micro-structure 102. Further, at this moment, the resin is also filled up in the anti-shrinkage convex section 103 provided on the molding transfer surface 101 of the micro-channel chip molding die 100. Namely, as shown in FIG. 3, a concave section is formed on the resin substrate 001 so as to be fitted into the anti-shrinkage convex section 103. Herein, as described above, since the temperature of the micro-channel chip molding die 100 is about the HDT, the solidified resin is in the state where deformation may occur with a load.

Using PMMA (Tg: 113-115° C., HDT: about 91-95° C.) as a resin, a specific example ranging from the state where a resin is melted to solidification will now be described. PMMA is a thermoplastic resin and melted by heating. As the melting method, a resin pellet (a bale-shaped resin of a diameter of about 1-2 mm and a length of about 2-5 mm) is dropped to the plasticizing cylinder section using an injection molding machine and then melted with combination of heating by the cylinder heater and shearing heating via rotation of the plasticizing screw. The ratio of heating by the cylinder heater to shearing heating (actually, the number of rotations of the screw) depends on the resin. The temperature of the injection cylinder to inject the resin is heated at 230-270° C. In this case, the temperature of the micro-channel chip molding die 100 is set at 80-120° C. The temperature of the resin during releasing is decreased to 80-120° C. which is the temperature of the micro-channel chip molding die 100.

After the resin substrate 001 has been solidified, the micro-channel chip molding die 100 is separated at the portion of line 106 in the vertical direction with respect to the paper plane of FIG. 2 to release the solidified resin substrate 001 from the micro-channel chip molding die 100. The filled resin is cooled down to the die temperature, whereby in the state where shrinkage stress is being applied to the resin substrate 001, the stress is released at the same time as releasing. Thereby, in common cases, rapid shape shrinkage occurs.

The operation of a resin substrate 001 and a micro-channel chip molding die 100 during this releasing will now be detailed. The resin substrate 001 and the micro-channel chip molding die 100 immediately prior to releasing are completely engaged as show in FIG. 3. Then, as the micro-channel chip molding die 100 is gradually separated, as shown in FIG. 4, the convex section of the micro-structure 102 on the molding transfer surface 101 is completely removed from the resin substrate 001. Since the portion of the micro-structure 102 in FIG. 4 is highest in the cavity direction of the micro-structure 102 as describe above, all the portions of the micro-structure 102 have been removed from the resin substrate 001. Thereby, releasing of the portion of the micro-channel 002 on the resin substrate 001 is completed. And, since the anti-shrinkage convex section 103 is higher than the highest portion of the cavity direction in the micro-structure 102 as described above, at the moment when the highest portion of the cavity direction in the micro-structure 102 has been removed from the resin substrate 001 (namely, at the moment when the micro-structure 102 has been entirely removed from the resin substrate 001), the anti-shrinkage convex section 103 has not yet been removed from the resin substrate 001. Namely, the molding transfer surface 101 is relatively removed in the order of the micro-structure 002 and the anti-shrinkage convex section 103 from the resin substrate 001.

At the stage where the convex section on the molding transfer surface 101 is removed from the resin substrate 001, the anti-shrinkage convex section 103 remains unremoved from the resin substrate 001 to the last, whereby the force resulting from shrinkage of the resin substrate 001 during releasing is applied only to the anti-shrinkage convex section 103. Thereby, large releasing deformation occurs in the anti-shrinkage convex section 103. In contrast, the micro-structure 102 is subjected to the force resulting from the shrinkage at least together with the anti-shrinkage convex section 103, whereby the force applied via shrinkage is dispersed and then releasing deformation in the micro-structure 102 can be reduced to a small extent. Thereby, the molded resin substrate 001 is formed as shown in FIG. 5.

The micro-channel 002 in FIG. 5 is a concave section of a resin substrate 001 and the anti-shrinkage hole 004 is also a concave section of the resin substrate 001. As described above, the micro-channel 002, shown in FIG. 5, of a molded resin substrate 001 is subjected to almost no releasing deformation, whereby the micro-channel 002 exhibits excellent transferability, and Rather excellent flatness is expressed in the vicinity of the micro-channel 002. On the other hand, the anti-shrinkage hole 004, shown in FIG. 5, of the resin substrate 001 is subjected to large releasing deformation, whereby in the vicinity thereof, flatness accuracy is decreased.

Herein, deformation in a micro-channel 002 is preferably reduced to at most 5% based on the depth of the micro-channel 002, more preferably at most 3%. In the micro-channel chip manufacturing method according to the present embodiment, reduction to at most 5% can be realized.

Next, the molded resin substrate 001 is joined to another resin substrate molded using another die. In this case, the area. B (refer to FIG. 5) of the resin substrate 001 is joined to another resin substrate. This area B corresponds to the area A in the micro-channel chip molding die 100 shown in FIG. 1, serving as the joining surface. As shown in FIG. 5, the anti-shrinkage hole 004 is provided in a portion other than the joining surface (the area B is located in a portion separated from the anti-shrinkage hole 004). Thereby, the flatness of the joining surface is favorably maintained. Therefore, a molded resin substrate 001 and another resin are favorably joined together.

<<Resin Substrate Material>>

Requirements for resins used for a resin substrate 001 include excellent moldability (transferability and releasability), enhanced transparency, and low self-fluorescent properties with respect to UV radiation or visual light with no specific limitation. For example, preferable are polycarbonate, polymethyl methacrylate, polystyrene, polyacrylonitrile, polyvinyl chloride, polyethylene terephthalate, Nylon 6, Nylon 66, polyvinyl acetate, polyvinylidene chloride, polypropylene, polyisoprene, polyethylene, polydimethylsiloxane, and cyclic polyolefin. Of these, polymethyl methacrylate and cyclic polyolefin are specifically preferable. Herein, for a resin substrate 001 and another resin substrate to be joined thereto, either the same material or different materials may be used.

As described above, in the present embodiment, to enhance the flatness of the joining surface, a anti-shrinkage convex section 103 was arranged in a portion other than the joining surface. However, when the flatness of the joining surface is not critical, placement can be made on the inner side of the joining surface. Further, in the present embodiment, the anti-shrinkage convex section 103 was simply arranged in a portion other than the joining surface. However, to further reduce the effect of shrinkage of a resin substrate 001, this anti-shrinkage convex section 103 is preferably arranged in the vicinity of the outer edge of the molding transfer surface 101 most distant from the runner section 105.

In the present embodiment, description was made under the following condition: as the anti-shrinkage convex section 103, a non-penetrated protrusion was formed on the molding transfer surface 101 of a micro-channel chip molding die 100. However, this protrusion may be penetrated. For example, as a micro-channel chip molding die 100, employable is a die constituted of a die having a molding transfer surface 101 where a micro-structure 102 is formed and a hole to allow a pin to penetrate to form a penetrated hole, as well as a pin allowed to penetrate through the hole. In this case, the pin functions as a anti-shrinkage convex section 103. For the case, it is necessary that in the state where the pin has been penetrated through the hole of a die, a resin is injected, and after the resin has been solidified, the die having a microstructure 102 is initially separated for mold release molding, followed by removal of the pin. Also, in such a micro-channel chip molding die, even when any micro-structure 102 is removed from a micro-channel 002, the pin serving as a anti-shrinkage convex section 103 remains stuck, whereby the force via shrinkage applied to the micro-channel 002 is dispersed. Thereby, deformation resulting from releasing can be reduced.

Modified Example 1

Figure 6:
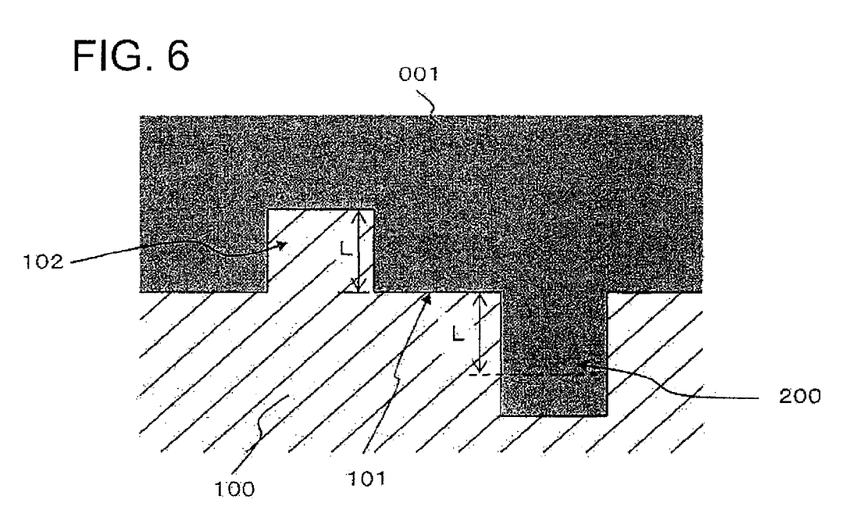
FIG. 6 is a schematic cross-sectional view in which a resin has been injected into a micro-channel chip molding die according to Modified Example 1.
Figure 7:
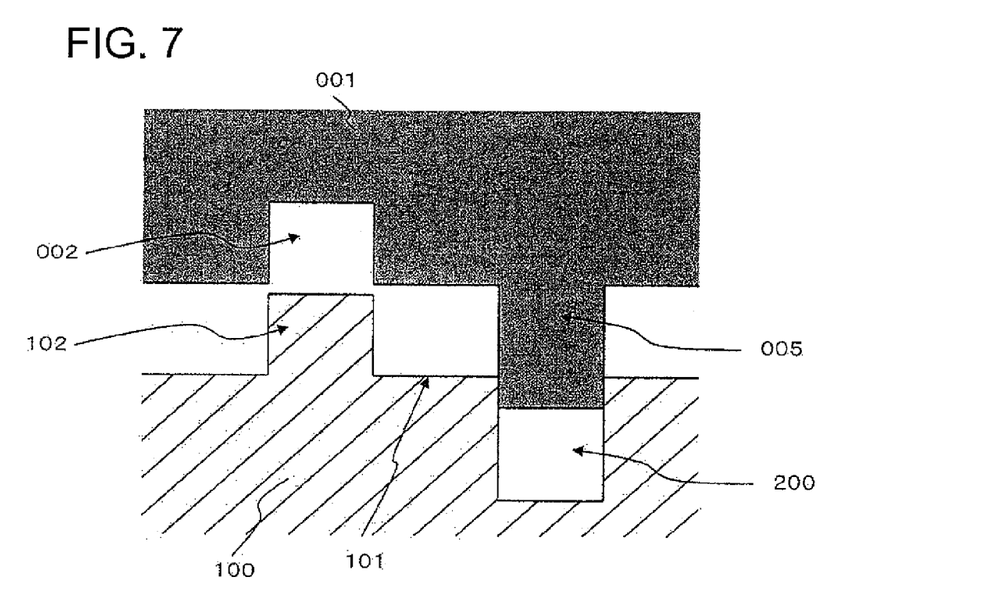
FIG. 7 is a schematic cross-sectional view of the moment when the micro-channel chip molding die according to Modified Example 1 is released from a molded resin substrate.

Next, Modified Example 1 of the above micro-channel chip manufacturing method and the micro-channel chip molding die used therefor will now be described with reference to FIG. 6 and FIG. 7. FIG. 6 is a schematic cross-sectional view in which a resin has been injected into a micro-channel chip molding die according to Modified Example 1. And, FIG. 7 is a schematic cross-sectional view of the moment when the micro-channel chip molding die according to Modified Example 1 is released from a molded resin substrate. In this modified example, as a structure to reduce releasing deformation of a micro-channel 002, a micro-channel chip molding die provided with a anti-shrinkage concave section will be described.

As shown in FIG. 6, a micro-channel chip molding die 100 according to Modified Example 1 has a anti-shrinkage concave section 200 toward the direction opposed to the cavity. The length (depth) of this anti-shrinkage concave section 200 in the direction opposed to the cavity is larger than the height L of the highest portion of the cavity direction in the microstructure 102. This anti-shrinkage concave section 200 is provided in a portion other than the joining surface.

A melted resin is injected into the micro-channel chip molding die 100 and then filled up in the cavity 104, whereby, as shown in FIG. 6, a concave section (a micro-channel) is formed on a resin substrate 001 corresponding to each microstructure 102. Further, as shown in FIG. 6, the resin is also filled up in the anti-shrinkage concave section 200 to form a protrusion on the resin substrate 001. Then, after solidification of the resin in the cooling step, the micro-channel chip molding die 100 is opened and separated for mold release molding.

In mid-course of separating the micro-channel chip molding die 100, at the moment when as shown in FIG. 7, every micro-structure 102 on the molding transfer surface 101 has been removed from the micro-channel 002, the anti-shrinkage protrusion 005 having been formed on the resin substrate 001 has not yet been removed firm the anti-shrinkage concave section 200. Namely, the molding transfer surface 101 is relatively removed in the order of the micro-structure 002 and the anti-shrinkage concave section 200 from the resin substrate 001.

Therefore, when removed from the micro-channel 002, every micro-structure 102 is subjected to the force resulting from shrinkage of the resin substrate 001 at least together with the anti-shrinkage protrusion 005. Thereby, the force via shrinkage of the resin substrate 001 applied to each micro-channel 002 is dispersed, whereby deformation during releasing of the micro-channel 002 can be reduced. At the moment when the anti-shrinkage concave section 200 is removed from the anti-shrinkage protrusion 005, only the anti-shrinkage protrusion 005 is subjected to the force resulting from shrinkage of the resin substrate 001, whereby large deformation occurs. However, since this anti-shrinkage concave section 200 is provided in a portion other than the joining surface, no adverse effects against the flatness of the joining surface and molding of a micro-channel 002 are produced even with such large deformation. Therefore, a resin substrate 001 having an accurate micro-channel 002 and exhibiting excellent flatness in the joining surface, as well as enabling to accurately join another resin substrate can be molded.

In Modified Example 1, to enhance the flatness of the joining surface, a anti-shrinkage concave section 200 was arranged in a portion other than the joining surface. However, when the flatness of the joining surface is not critical, placement can be made on the inner side of the joining surface. Further, in the present embodiment, the anti-shrinkage concave section 200 was simply arranged in a portion other than the joining surface. However, to further reduce the effect of shrinkage of a resin substrate 001, this anti-shrinkage concave section 200 is preferably arranged in the vicinity of the outer edge of the molding transfer surface 101 most distant from the runner section 105.

In this manner, even with a constitution in which a concave section is provided for a micro-channel chip molding die 100, releasing deformation in a micro-channel 002 can be reduced to at most 5% of the micro-channel 002, resulting in almost the same result as in the constitution in which a convex section is provided for a micro-channel chip molding die 100. In this manner, even with such a constitution in which a concave section is provided for a micro-channel chip molding die 100, the accuracy of a micro-channel 002 and the flatness of the joining surface can be enhanced.

Modified Example 2

Figure 8:
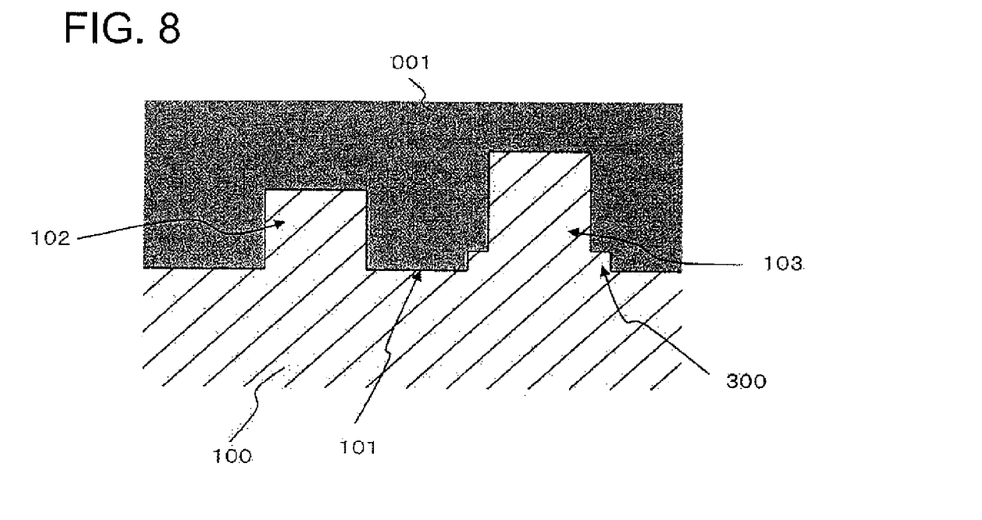
FIG. 8 is a schematic cross-sectional view in which a resin has been injected into a micro-channel chip molding die according to Modified Example 2.
Figure 9:
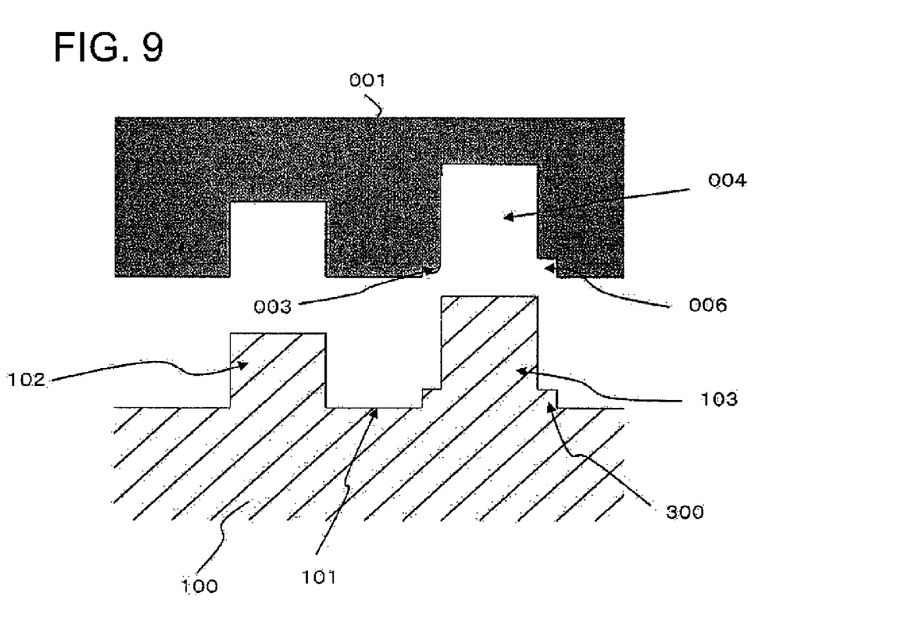
FIG. 9 is a schematic cross-sectional view in which the micro-channel chip molding die according to Modified Example 2 has been released from a molded resin substrate.

Further, Modified Example 2 of the above micro-channel chip manufacturing method and the micro-channel chip molding die used therefor will now be described with reference to FIG. 8 and FIG. 9. FIG. 8 is a schematic cross-sectional view in which a resin has been injected into a micro-channel chip molding die according to Modified Example 2. FIG. 9 is a schematic cross-sectional view in which the micro-channel chip molding die according to Modified Example 2 has been released from a molded resin substrate. In this modified example, a micro-channel chip molding die provided with a structure in which releasing deformation in a anti-shrinkage concave section is absorbed will be described.

As shown in FIG. 8, the micro-channel chip molding die 100 according to the present modified example has a constitution in which a anti-deformation convex section 300 is provided in the boundary portion of the anti-shrinkage convex section 103 and the molding transfer surface 101. In the present modified example, description will be made under the following condition: the anti-shrinkage convex section 103 has a depth of 60 μm, being considered to have a circular shape of a size of 60 μm in the molding transfer surface direction. The anti-deformation convex section 300 has a depth of 10 μm and a size of 10 μm as the width in the molding transfer surface direction. Herein, in the present embodiment, since the rising amount in releasing deformation in the anti-shrinkage convex section 103 having a depth of 10 μm and a width of 60 μm in the molding transfer surface direction is empirically determined to be at most 5 μm, as the size to absorb this deformation, the size of the anti-deformation convex section 300 was set as described above. However, the size of the anti-deformation convex section 300 needs only to have almost the same capacity as in the size of a rising portion in releasing deformation empirically determined based on the size of the anti shrinkage convex section 103. Further, a value obtained by subtracting the height of the cavity direction of the anti-deformation convex section 300 from the height of the cavity direction of the anti-shrinkage convex section 103 is larger than that of the height of the highest portion of the cavity direction in the micro-structure 102.

A melted resin is injected into the micro-channel chip molding die 100 and then filled up in the cavity 104, whereby, as shown in FIG. 8, a concave section (a micro-channel) is formed on a resin substrate 001 corresponding to each microstructure 102. Further, as shown in FIG. 8, as the resin is also filled up in the anti-shrinkage convex section 103, a protrusion is formed on the resin substrate 001 with the concave state of the portion of the anti-deformation convex section 300. Then, after the resin has been solidified by cooling, the micro-channel chip molding die 100 is opened and separated for mold release molding. In this mold release molding, a anti-deformation concave section 006 is structured in the opening portion of the anti-shrinkage hole 004 corresponding to the anti-deformation convex section 300.

In mid-course of separating the micro-channel chip molding die 100, at the moment when every micro-structure 102 on the molding transfer surface 101 has been removed from the micro-channel 002, the anti-shrinkage hole 004 having been formed on the resin substrate 001 has not yet been removed from the anti-shrinkage convex section 103.

Therefore, when released from the micro-channel 002, every micro-structure 102 is subjected to the force resulting from shrinkage of the resin substrate 001 at least together with the anti-shrinkage hole 004. Thereby, the force via shrinkage of the resin substrate 001 applied to each micro-channel 002 is dispersed. Therefore, deformation resulting from releasing of the micro-channel 002 can be reduced. Then, at the moment when the anti-shrinkage convex section 103 is released from the anti-shrinkage hole 004, the force via shrinkage of the resin substrate 001 is applied only to the anti-shrinkage hole 004, whereby rising due to deformation occurs.

The resin rises due to deformation of the anti-shrinkage hole 004. And then, as show in FIG. 9, deformation 003 occurs. This deformation 003 fits in the anti-deformation concave section 006 formed in the opening portion of the anti-shrinkage hole 004. Thereby, the rising of the deformation 003 resulting from releasing deformation of the anti-shrinkage hole 004 is absorbed by the anti-deformation concave section 006, resulting in no effects against the molding transfer surface 101. Thereby, releasing deformation in the anti-shrinkage convex section 103 is absorbed, whereby adverse effects against the flatness of the molding transfer surface 101 are reduced. Therefore, even when the molding transfer surface 101 is arranged on the inner side of the joining surface, a resin substrate having an accurate microchannel 002 and exhibiting excellent flatness in the joining surface, as well as enabling to accurately join another resin substrate can be molded.

Example 1

Next, specific Example 1 will now be described.

In Example 1, based on the method according to the embodiment, a micro-channel chip was produced. Initially, to produce a resin substrate 001, a micro-channel chip molding die 100 was produced specifically as follows:
Resin material: PMMA
Melting temperature t1=250° C.
Melting temperature t2=93° C.
The height of the highest portion of the cavity direction in the micro-structure 102 (the depth of the deepest portion of the micro-channel 002) d1=50 μm The height of the anti-shrinkage convex section 103 d2=60 μm The size of the anti-shrinkage convex section=0.003 mm$^2$ The location of the anti-shrinkage convex section 103=the symbol 103 in FIG. 3

Then, using an injection molding machine employing the micro-channel chip molding die 100, PMMA, a transparent resin material, was molded to produce a resin substrate 001 in which on the surface of a 30 mm square plate-shaped member having a thickness of 1.5 mm, a micro-channel 002 and a anti-shrinkage hole 004 were formed.

(Evaluation)

Deformation in the micro-channel 002 is 4.5% based on the depth of the micro-channel 002. This value is less than 5%, which is evaluated to be excellent. Further, deformation in the anti-shrinkage hole 004 is 8.3%. This value is at least 5%, which is evaluated to be poor.

Example 2

Next, specific Example 2 will now be described.

In Example 2, based on the method according to Modified Example 1, a micro-channel chip was produced. Initially, to produce a resin substrate 001, a micro-channel chip molding die 100 was produced specifically as follows:
Resin material: PMMA
Melting temperature=250° C.
Mold release temperature t=93° C.
The height of the highest portion of the cavity direction in the micro-structure 102 (the depth of the deepest portion of the micro-channel 002) d1=50 μm
The length of the anti-shrinkage concave section 200 d3=60 μm
The size of the anti-shrinkage concave section 200=0.003 mm$^2$
The location of the anti-shrinkage concave section 200=the symbol 200 in FIG. 6

Then, using the injection molding machine employing the micro-channel chip molding die 100, PMMA, a transparent resin material, was molded to produce a resin substrate 001 in which on the surface of a 30 mm square plate-shaped member having a thickness of 1.5 mm, a micro-channel 002 and a anti-shrinkage hole 004 were formed.

(Evaluation)

Deformation in the micro-channel 002 is 4.7% based on the depth of the micro-channel 002. This value is less than 5%, which is evaluated to be excellent. Further, deformation in the anti-shrinkage hole 004 is 83%. This value is at least 5%, which is evaluated to be poor.

Comparative Example

Next, a comparative example will now be described.

In the comparative example, based on the conventional method (namely, a mold release molding method with no use of a anti-shrinkage convex section 103), a micro-channel chip was produced. Initially, to produce a resin substrate 001, a micro-channel chip molding die 100 was produced specifically as follows:
Resin material: PMMA
Melting temperature=250° C.
Mold release temperature t=93° C.
The height of the highest portion of the cavity direction in the micro-structure 102 (the depth of the deepest portion of the micro-channel 002) d1=50 μm (Evaluation)

Deformation in the micro-channel 002 is 8.3% based on the depth of the micro-channel 002. This value is at least 5%, which is evaluated to be poor.

(Comparison Result)

As described above, in Comparative Example, the required accuracy is not achieved and the flatness of the joining surface is degraded. In contrast, in Example 1 and Example 2, the required accuracy is achieved and the flatness of the joining surface is favorably maintained. Therefore, when a micro-channel chip is manufactured based on either of the methods of Examples, a micro-channel chip having a more accurate micro-channel and exhibiting excellent consistency can be manufactured.

DESCRIPTION OF THE SYMBOLS

001: resin substrate
002: micro-channel
003: deformation
004: anti-shrinkage hole
005: anti-shrinkage protrusion
006: anti-deformation concave section
100: micro-channel chip molding die
101: molding transfer surface
102: micro-structure
103: anti-shrinkage convex section
104: cavity
105: runner section
200: anti-shrinkage concave section
300: anti-deformation convex section

The invention claimed is:

1. A method for manufacturing a micro-channel chip using a resin substrate comprising the steps of:
    injecting a melted resin into a die having a cavity capable of containing the melted resin, a micro-structure provided on a surface of the die to form the cavity so as to protrude toward the cavity side from the surface, and a convex section protruding higher than the micro-structure toward the cavity side from the surface;
    removing the surface of the die relatively from the resin substrate having been formed by solidifying the injected resin in an order of the micro-structure and the convex section; and
    joining another resin substrate to the resin substrate so as to cover a portion of the resin substrate where the micro-structure has been transferred and to lie at a portion separated from a hole formed by the convex section.

2. The method for manufacturing a micro-channel chip according to claim 1, wherein the convex section is arranged in a vicinity of an outer edge of the surface which is most distant from an injection opening to inject a melted resin into the cavity provided in the die.

3. A method for manufacturing a micro-channel chip using a resin substrate comprising the steps of:
    injecting a melted resin into a die having a cavity capable of containing the melted resin, a micro-structure provided on a surface of the die to form the cavity so as to protrude toward the cavity side from the surface, and a concave section provided deeper than the height of the micro-structure in the direction opposed to the protruding direction of the micro-structure;
    removing the surface of the die relatively from the resin substrate having been formed by solidifying the injected resin in an order of the micro-structure and the concave section; and
    joining another resin substrate to the resin substrate so as to cover a portion of the resin substrate where the micro-structure has been transferred and to lie at a portion separated from a protrusion formed by the concave section.

4. The method for manufacturing a micro-channel chip according to claim 3, wherein the concave section is arranged in a vicinity of an outer edge of the surface which is most distant from an injection opening to inject a melted resin into the cavity provided in the die.

5. A die for molding a micro-channel chip to mold a resin substrate of the micro-channel chip in which two resin substrates are joined and a micro-channel groove is formed on a surface of at least one of the two resin substrates, the two resin substrates are joined so that the surface where the micro-channel groove is formed faces inward, the die for molding comprising:
    a cavity capable of containing a melted resin to form the resin substrate in which the micro-channel groove is formed,
    a micro-structure provided on a surface that forms the cavity so as to protrude toward the cavity side from the surface, and
    a convex section which protrudes higher than the micro-structure toward the cavity side from the surface,
    wherein the convex section is provided in a portion other than a surface where the two resin substrates are joined.

6. A die for molding a micro-channel chip to mold a resin substrate of the micro-channel chip in which two resin substrates are joined and a micro-channel groove is formed on a surface of at least one of the two resin substrates, the two resin substrates are joined so that the surface where the micro-channel groove is formed faces inward, the die for molding comprising:
    a cavity capable of containing a melted resin to form the resin substrate in which the micro-channel groove is formed,
    a micro-structure provided on a surface that forms the cavity so as to protrude toward the cavity side from the surface, and
    a concave section which is provide in a direction opposite to a protruding direction of the micro-structure and a depth of the concave section is greater than a height of the micro-structure,
    wherein the concave section is provided in a portion other than a surface where the two resin substrates are joined.

7. A micro-channel chip in which two resin substrates are joined and a micro-channel where liquid is introduced is formed on a surface of at least one of the two resin substrates by injection molding in which a melted resin is injected, the two resin substrates are joined so that the surface where the micro-channel is formed faces inward, the micro-channel chip comprising:
    a concave section longer than a maximum length in a depth direction of the micro-channel provided on the surface where the micro-channel is formed at a location other than the micro-channel,
    wherein the two resin substrates cover a portion where the micro-structure has been transferred and are joined at a portion separated from the concave section.

\* \* \* \* \*